US009368196B2

(12) United States Patent
Sakamoto et al.

(10) Patent No.: US 9,368,196 B2
(45) Date of Patent: *Jun. 14, 2016

(54) SEMICONDUCTOR MEMORY DEVICE

(71) Applicant: Kabushiki Kaisha Toshiba, Minato-ku (JP)

(72) Inventors: Kei Sakamoto, Nagoya (JP); Takayuki Okamura, Yokkaichi (JP); Nobuaki Yasutake, Yokkaichi (JP); Jun Nishimura, Kuwana (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/578,847

(22) Filed: Dec. 22, 2014

(65) Prior Publication Data

US 2015/0124516 A1    May 7, 2015

Related U.S. Application Data

(63) Continuation of application No. 13/778,371, filed on Feb. 27, 2013, now Pat. No. 8,937,830.

(30) Foreign Application Priority Data

Jul. 2, 2012    (JP) .................................. 2012-148633

(51) Int. Cl.
*G11C 13/00* (2006.01)
*H01L 45/00* (2006.01)
*H01L 27/24* (2006.01)

(52) U.S. Cl.
CPC ........ *G11C 13/0002* (2013.01); *G11C 13/0023* (2013.01); *H01L 27/2409* (2013.01);
(Continued)

(58) Field of Classification Search
CPC ........................ G11C 13/0002; G11C 13/0004
USPC .................................................. 365/148, 163
See application file for complete search history.

(56) References Cited

U.S. PATENT DOCUMENTS 8,339,834 B2 * 12/2012 Nakai .................... G11C 14/00
257/2
8,569,733 B2 * 10/2013 Yasutake ............. H01L 27/2409
257/4

(Continued)

FOREIGN PATENT DOCUMENTS

JP    2010-282989    12/2010
JP     2011-9485      1/2011

(Continued)

*Primary Examiner* — Michael Tran
(74) *Attorney, Agent, or Firm* — Oblon, McClelland, Maier & Neustadt, L.L.P.

(57) ABSTRACT

A semiconductor memory device according to an embodiment includes a memory cell array including memory cells, the memory cells each configured having a current rectifier element and a variable resistance element connected in series therein. Each of the memory cells has formed on a side surface thereof: a first insulating film provided on a side surface of the current rectifier element and the variable resistance element and having a composition ratio of a non-silicon element to silicon which is a first value; a silicon oxide film provided on a side surface of the first insulating film; and a second insulating film provided on a side surface of the silicon oxide film and having a composition ratio of a non-silicon element to silicon which is a second value. The first value is smaller than the second value.

19 Claims, 4 Drawing Sheets

(52) U.S. Cl.
CPC ............ *H01L27/2463* (2013.01); *H01L 45/04* (2013.01); *H01L 45/06* (2013.01); *H01L 45/08* (2013.01); *H01L 45/085* (2013.01); *H01L 45/10* (2013.01); *H01L 45/12* (2013.01); *H01L 45/1233* (2013.01); *G11C 2213/72* (2013.01)

(56) References Cited

U.S. PATENT DOCUMENTS

| | | |
|---|---|---|
| 2009/0121208 A1 | 5/2009 | Nagashima et al. |
| 2010/0200833 A1 | 8/2010 | Sim et al. |
| 2010/0302842 A1 | 12/2010 | Kawagoe et al. |
| 2011/0205781 A1* | 8/2011 | Nakai ............... G11C 14/00 365/148 |
| 2011/0233500 A1 | 9/2011 | Nishimura et al. |
| 2011/0233502 A1 | 9/2011 | Shigeoka et al. |
| 2012/0145986 A1 | 6/2012 | Yasutake |

FOREIGN PATENT DOCUMENTS

| | | |
|---|---|---|
| JP | 2011-71380 | 4/2011 |
| JP | 2011-199197 | 10/2011 |

* cited by examiner

SEMICONDUCTOR MEMORY DEVICE

CROSS REFERENCE TO RELATED APPLICATION

This application is a continuation of and claims the benefit of priority under 35 U.S.C. §120 from U.S. Ser. No. 13/778,371 filed Feb. 27, 2013 (now U.S. Pat. No. 8,937,830 issued Jan. 20, 2015), and claims the benefit of priority under 35 U.S.C. §119 from Japanese Patent Application No. 2012-148633 filed Jul. 2, 2012, the entire contents of each of which are incorporated herein by reference.

BACKGROUND

1. Field

Embodiments described in the present specification relate to a semiconductor memory device configured as an arrangement of memory cells each storing data by a change in resistance value of a variable resistance element.

2. Description of the Related Art

In recent years, resistance varying memory devices that employ a variable resistance element as a storage element have been receiving attention as successor candidates of flash memory. Resistance varying memory devices are assumed here to include not only resistance varying memory in a narrow sense, that is, resistance varying memory that configures a transition metal oxide as a recording layer and stores a resistance value state of the transition metal oxide in a non-volatile manner (ReRAM: Resistive RAM), but also phase change memory that employs chalcogenide or the like as a recording layer and uses resistance value information of a crystalline state (conductor) and an amorphous state (insulator) of the chalcogenide or the like (PCRAM: Phase Change RAM), and so on.

A memory cell array in a resistance varying memory device has memory cells disposed at intersections of bit lines and word lines, each memory cell being configured from a variable resistance element and a current rectifier element such as a diode or the like. In such a memory cell array, selection of a memory cell can be performed using the current rectifier element such as a diode or the like. Moreover, it is also possible for a high-density memory cell array to be realized by alternately stacking the bit lines and word lines to configure a three-dimensional stacked arrangement of memory cell arrays.

In the case of such a memory cell array, characteristics of the variable resistance element or the current rectifier element sometimes deteriorate due to effects from a material employed as an interlayer insulating film or due to repeatedly performed operations, and so on. In that case, there is a possibility of a leak current occurring in the diode when the diode is off, or of effects such as deterioration of switching characteristics of the variable resistance element arising, whereby desired operations on the memory cells cannot be executed.

DETAILED DESCRIPTION

A semiconductor memory device according to an embodiment comprises: a plurality of first lines disposed on a substrate; a plurality of second lines disposed intersecting the first lines; a memory cell array including memory cells, the memory cells disposed at each of intersections of the first lines and the second lines and each configured having a current rectifier element and a variable resistance element connected in series therein; and a control circuit configured to selectively drive the first lines and the second lines. Each of the memory cells has formed on a side surface thereof: a first insulating film including silicon and nitrogen and the first insulating film provided on a side surface of the current rectifier element and the variable resistance element and having a composition ratio of a non-silicon element to silicon which is a first value; a silicon oxide film provided on a side surface of the first insulating film; and a second insulating film including silicon and nitrogen and the second insulating film provided on a side surface of the silicon oxide film and having a composition ratio of a non-silicon element to silicon which is a second value. The first value is smaller than the second value.

Next, embodiments of the present invention are described in detail with reference to the drawings. Note that in the descriptions of the drawings in the embodiments below, identical symbols are assigned to places having an identical configuration, and duplicated descriptions of such places are omitted.

[Overall Configuration]

Figure 1:
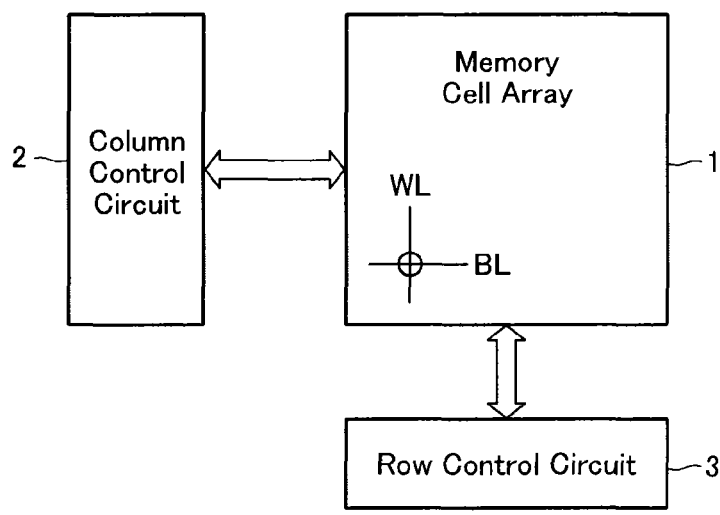
FIG. 1 is one example of a block diagram of a semiconductor memory device according to a first embodiment of the present invention.

FIG. 1 is one example of a block diagram showing a configuration of a nonvolatile memory according to a first embodiment of the present invention. This nonvolatile memory comprises a memory cell array 1 having memory cells disposed in a matrix therein, each of the memory cells using a variable resistance element VR to be described later.

Electrically connected to a bit line BL of the memory cell array 1 in order to control the bit line BL of the memory cell array 1 to perform data erase of the memory cell, data write to the memory cell, and data read from the memory cell is a column control circuit 2 for controlling a voltage of the bit line BL. Moreover, electrically connected to a word line WL of the memory cell array 1 in order to select the word line WL of the memory cell array 1 to perform data erase of the memory cell, data write to the memory cell, and data read from the memory cell is a row control circuit 3 for controlling a voltage of the word line WL.

[Memory Cell Array 1]

Figure 2:
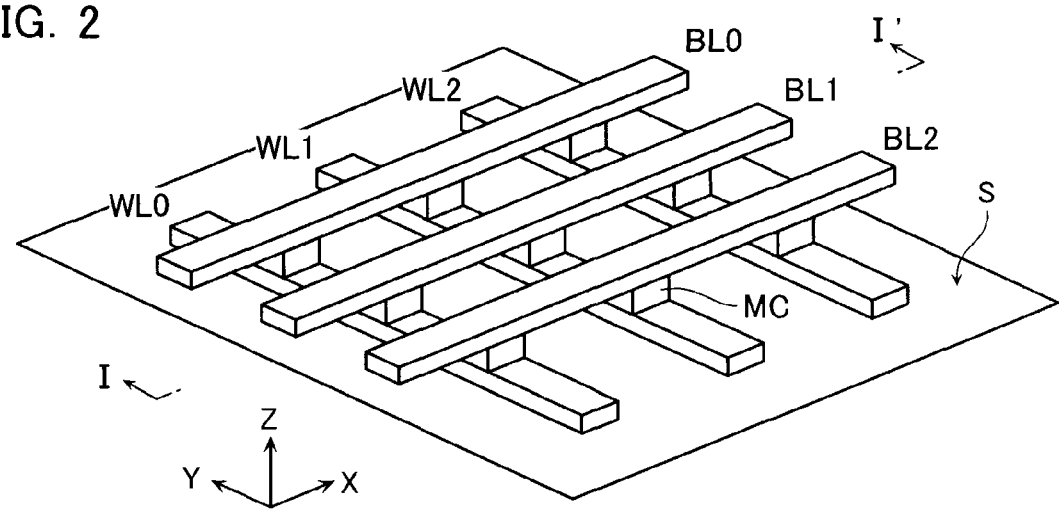
FIG. 2 is one example of a perspective view of part of a memory cell array 1.
Figure 3:
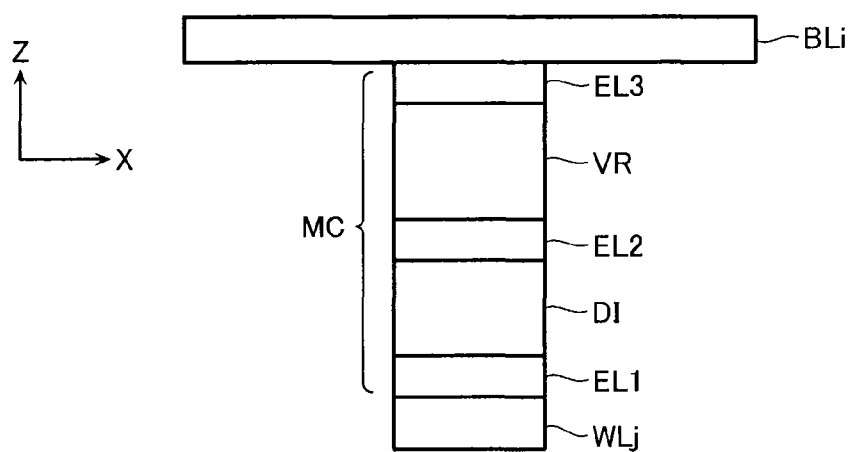
FIG. 3 is one example of a cross-sectional view taken along the line I-I' and looking in the direction of the arrows in FIG. 2, showing a single memory cell portion.

FIG. 2 is one example of a perspective view of part of the memory cell array 1, and FIG. 3 is one example of a cross-sectional view taken along the line I-I' and looking in the direction of the arrows in FIG. 2, showing a single memory cell portion. Word lines WL0~WL2 acting as a plurality of first lines are arranged in a Y direction parallel to a surface of a semiconductor substrate S. Bit lines BL0~BL2 acting as a plurality of second lines are arranged in an X direction parallel to the surface of the semiconductor substrate S so as to intersect the word lines WL. A memory cell MC is disposed at each of intersections of the word lines WL0~WL2 and the bit lines BL0~BL2 so as to be sandwiched by both lines. The first and second lines are preferably of a material which is heat-resistant and has a low resistance value. For example, W, WN, WSi, NiSi, CoSi, and so on, may be employed as the material of the first and second lines.

[Memory Cell MC]

As shown in FIG. 3, the memory cell MC is a circuit having a variable resistance element VR and a current rectifier element, for example, a diode DI, or the like, connected in series in a Z direction perpendicular to the semiconductor substrate S. Disposed above and below the variable resistance element VR and the diode DI are electrodes EL1, EL2, and EL3 functioning as a barrier metal and an adhesive layer. The diode DI is disposed on the electrode EL1, and the electrode EL2 is disposed on the diode DI. The variable resistance element VR is disposed on the electrode EL2, and the electrode EL3 is disposed on the variable resistance element VR. Employable as an electrode material of the electrodes EL1, EL2, and EL3 is, for example, titanium nitride (TiN). Moreover, it is also possible for a different material to be adopted for each of the materials of the electrodes EL1, EL2, and EL3. For example, the following may also be employed as the material of the electrodes, namely Pt, Au, Ag, TiAlN, SrRuO, Ru, RuN, Ir, Co, Ti, TaN, LaNiO, Al, PtIrO$_x$, PtRhO$_x$, Rh, TaAlN, W, WN, TaSiN, TaSi$_2$, TiSi, TiC, TaC, Nb—TiO$_2$, NiSi, CoSi, and so on. In addition, insertion of a metal film to make orientation uniform is also possible. Moreover, inserting a separate buffer layer, barrier metal layer, adhesive layer, and so on, is also possible. Furthermore, a structure that changes an order in the Z direction of the diode DI and the variable resistance element VR is also included in embodiments of the present invention.

[Variable Resistance Element]

Employed as the variable resistance element VR is a substance capable of having its resistance value changed via an electric field, a current, heat, chemical energy, and so on, by application of a voltage. For example, the following may be employed as the variable resistance element VR, namely: an element that has its resistance value changed by a shift in phase between a crystalline state and an amorphous state in the manner of chalcogenide, or the like (PCRAM); an element that has its resistance value changed by depositing metal cations to form a contacting bridge between electrodes, and ionizing the deposited metal to destroy the contacting bridge (CBRAM); an element where the resistance value changes by application of a voltage or current (broadly divided into an element where a resistance change occurs due to presence/absence of trapped charge in a charge trap existing at an electrode interface, and an element where a resistance change occurs due to presence/absence of a conductive path resulting from oxygen deficiency, or the like) (ReRAM); and so on.

[Current Rectifier Element]

The current rectifier element employed in the memory cell MC is not specifically limited regarding a material, structure and so on, provided it is an element having a current rectifying characteristic in its voltage-current characteristics. One example of the current rectifier element is a diode DI manufactured by polysilicon (Poly-Si). Employable as the diode DI is, for example, a PIN diode having a p-type layer and an n-type layer that include impurities, and an i layer inserted between these p-type and n-type layers that does not include an impurity. Moreover, the following may also be employed as the diode DI, namely a PN junction diode comprising a p-type layer and an n-type layer, various kinds of diodes such as a Schottky diode, a punch-through diode, and so on.

[Memory Cell Array and its Peripheral Circuits]

Figure 4:
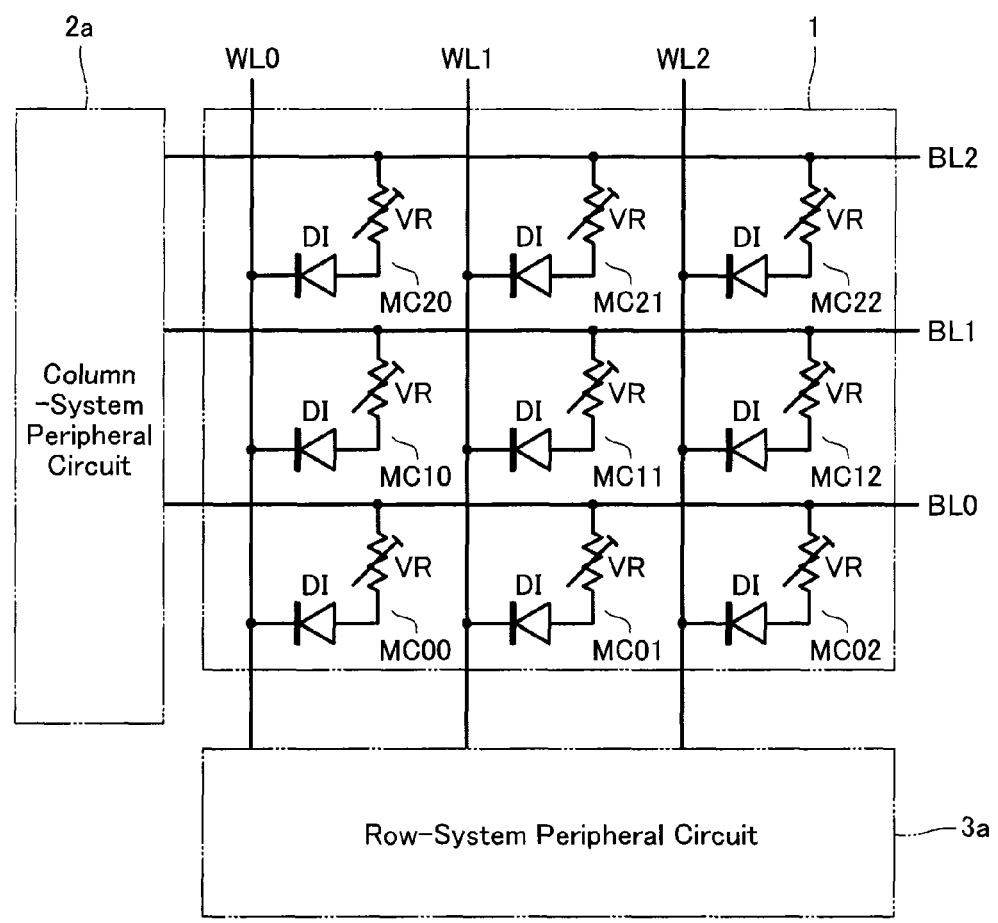
FIG. 4 is one example of a circuit diagram of the memory cell array 1 and peripheral circuits of the memory cell array 1.

FIG. 4 is one example of a circuit diagram of the memory cell array 1 and its peripheral circuits. In FIG. 4, the memory cell MC is configured by the variable resistance element VR and the diode DI. The diode DI has a current rectifying characteristic such that current flows through a selected memory cell MC from a selected bit line BL to a selected word line WL. One end of each of the bit lines BL is connected to a column-system peripheral circuit 2a which is part of the column control circuit 2. In addition, one end of each of the word lines WL is connected to a row-system peripheral circuit 3a which is part of the row control circuit 3. Voltages required in operations on the bit lines BL and the word lines WL are supplied by these column-system peripheral circuit 2a and row-system peripheral circuit 3a. The column-system peripheral circuit 2a and the row-system peripheral circuit 3a may each be appended with a different function required in operational control of the bit lines BL and the word lines WL.

[Configuration of Periphery of Memory Cell MC]

Figure 5:
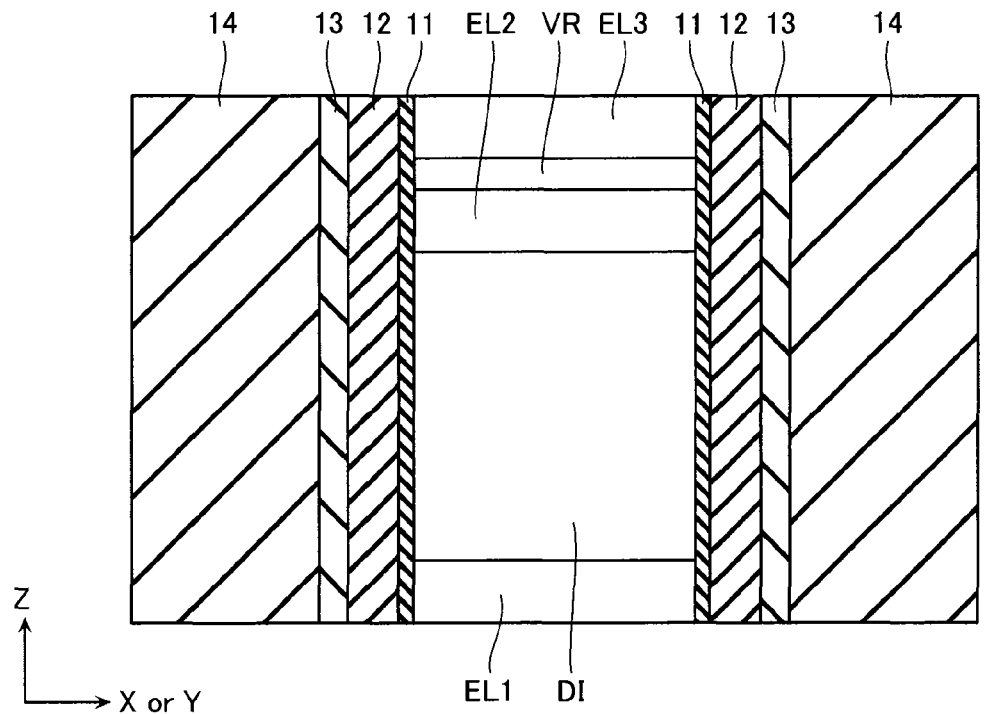
FIG. 5 is one example of a cross-sectional view showing the memory cell and a periphery of the memory cell in the first embodiment.

A configuration of a periphery of the memory cell MC in the present embodiment is described below with reference to FIG. 5. FIG. 5 is one example of a cross-sectional view showing the memory cell MC and the periphery of the memory cell MC in the present embodiment. As mentioned above, the memory cell MC has a structure where the variable resistance element VR, the diode DI, and the electrodes EL1, EL2, and EL3 are stacked in the Z direction. Note that lateral direction of FIG. 5 may be the X direction, or may be the Y direction.

Now, the memory cell MC in the present embodiment has three layers of films formed on its side surface. A silicon nitride film 11 is provided on a side surface of the variable resistance element VR, the diode DI, and the electrodes EL1, EL2, and EL3. This silicon nitride film 11 is a film formed such that a composition ratio of nitrogen to silicon (N/Si) configuring the silicon nitride film 11 has a value smaller than, for example, 1.33. (Here, the composition ratio of nitrogen to silicon configuring the silicon nitride film 11 is assumed to mean a value of the number of nitrogen atoms configuring the silicon nitride film 11 divided by the number of silicon atoms configuring the silicon nitride film 11. For example, the composition ratio of a silicon nitride film expressed by a composition formula Si$_3$N$_4$ is 1.33.) Moreover, the silicon nitride film 11 is provided with a film thickness of, for example, about 1 nm~3 nm.

In addition, a silicon oxide film 12 is provided on a side surface of the silicon nitride film 11. The silicon oxide film 12 is provided with a thickness of, for example, 1 nm or more, and is preferably provided with a film thickness greater than that of the silicon nitride film 11.

Moreover, a silicon nitride film 13 is provided on a side surface of the silicon oxide film 12. This silicon nitride film 13 is a film formed such that a composition ratio of nitrogen to silicon (N/Si) configuring the silicon nitride film 13 is, for example, 1.33. The silicon nitride film 13 is provided with a thickness of, for example, 1 nm or more, and is preferably provided with a film thickness greater than that of the silicon nitride film 11. Here, the composition ratio of nitrogen to silicon (N/Si) configuring the silicon nitride film 11 need only be smaller than the composition ratio of nitrogen to silicon configuring the silicon nitride film 13. This is because, as mentioned later, providing the silicon nitride film 11 having a small composition ratio of nitrogen to silicon and the silicon oxide film 12 results in characteristics of the diode DI being improved.

The memory cell MC, and the silicon nitride film 11, silicon oxide film 12, and silicon nitride film 13 formed on the side surface of the memory cell MC are buried by an interlayer insulating film 14. Employed as the interlayer insulating film 14 is, for example, polysilazane (PSZ).

In other words, the silicon nitride film 11 contacts a side surface of the memory cell MC, and the silicon oxide film 12 contacts a side surface of the silicon nitride film 11 on an opposite side to the memory cell MC. The silicon nitride film 13 contacts a side surface of the silicon oxide film 12 on an opposite side to the memory cell MC.

[Advantages]

Figure 6:
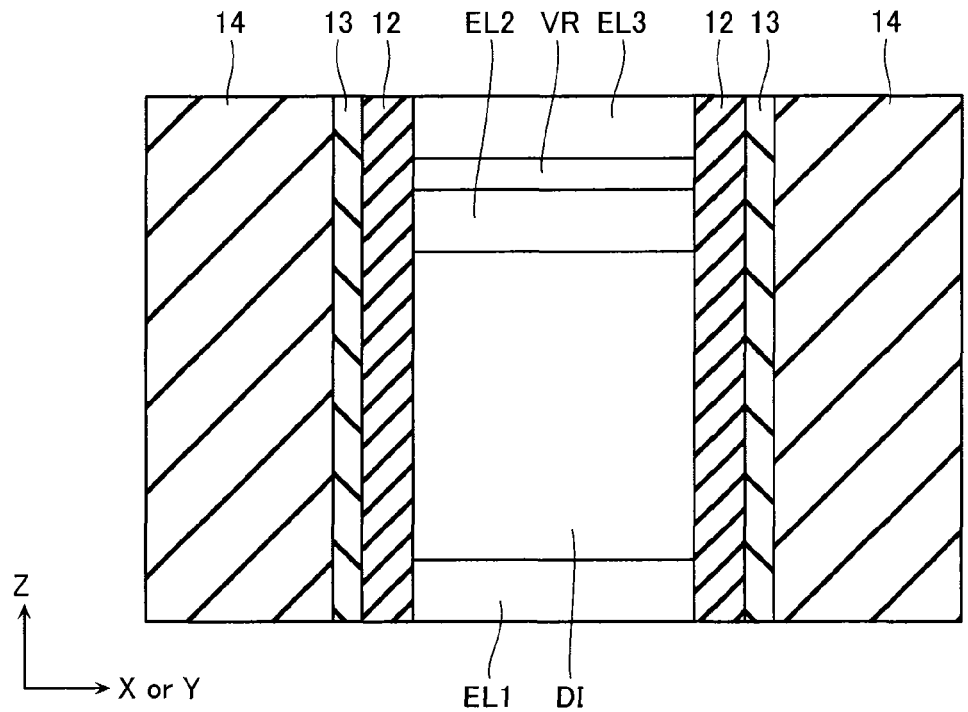
FIG. 6 is one example of a cross-sectional view showing a memory cell and a periphery of the memory cell in a comparative example.
Figure 7:
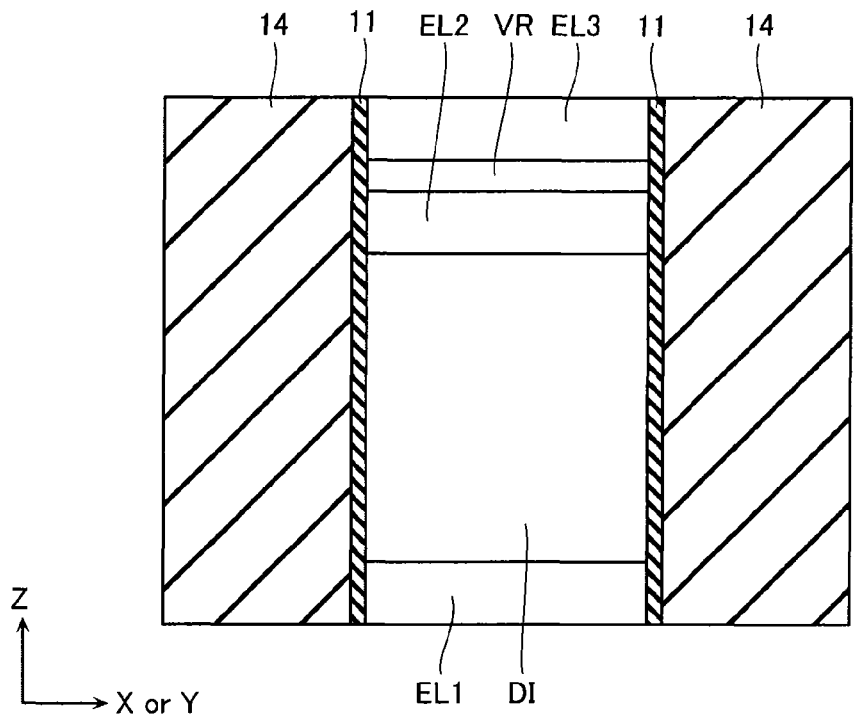
FIG. 7 is one example of a cross-sectional view showing a memory cell and a periphery of the memory cell in a comparative example.

Advantages of the silicon nitride film 11, the silicon oxide film 12, and the silicon nitride film 13 formed on the side surface of the memory cell MC in the present embodiment are described below with reference to comparative examples. FIGS. 6 and 7 are cross-sectional views showing a memory cell and a periphery of the memory cell in the comparative examples.

The comparative example shown in FIG. 6 differs in structure from the embodiment shown in FIG. 5 in not having the silicon nitride film 11 formed on the side surface of the memory cell MC. Moreover, the comparative example shown in FIG. 7 differs in structure from the embodiment shown in FIG. 5 in not having the silicon oxide film 12 and the silicon nitride film 13 formed on the side surface of the silicon nitride film 11.

As shown in FIG. 6, if the silicon oxide film 12 and the silicon nitride film 13 are formed, impurities such as carbon or oxygen released from the interlayer insulating film 14 can be deterred from reaching the memory cell MC. However, in a structure not having the silicon nitride film 11 formed, the variable resistance element VR contacts the silicon oxide film 12 directly. At this time, there is a risk that the variable resistance element VR is oxidized by oxygen in the silicon oxide film 12, thereby causing an operational defect that the operation is not completed by a certain voltage. Moreover, it is easy for electrons and holes to be trapped at an interface of the diode DI and the silicon oxide film 12, thereby causing an increase in leak current flowing when the diode DI is off. As a result, operational characteristics of the memory cell MC in the configuration of the comparative example shown in FIG. 6 deteriorate.

In addition, as shown in FIG. 7, when only a single layer of the silicon nitride film 11 having a small composition ratio of nitrogen to silicon is formed, a trap level of an interface between the diode DI and the silicon nitride film 11 is lowered due to oxygen released from the interlayer insulating film 14. This enables leak current flowing when the diode DI is off to be reduced. However, there is a risk that if the silicon nitride film 11 is oxidized by oxygen released from the interlayer insulating film 14, the variable resistance element VR also is oxidized by oxygen in the silicon nitride film 11, thereby causing an operational defect that the operation is not completed by a certain voltage. As a result, operational characteristics of the memory cell MC in the configuration of the comparative example shown in FIG. 7 deteriorate.

To counter this, as shown in FIG. 5, in the structure of the present embodiment, the silicon nitride film 11, the silicon oxide film 12, and the silicon nitride film 13 are formed on the side surface of the memory cell MC. In this case, the silicon nitride film 11 contacts the side surface of the memory cell MC. Since the silicon oxide film 12 and the silicon nitride film 13 are further formed additionally on the side surface of this silicon nitride film 11, oxidation of the variable resistance element VR due to oxygen released from the interlayer insulating film 14 can be reliably prevented up to the silicon nitride film 11, whereby an operational defect of the memory cell MC can be suppressed. Now, if oxidation of the variable resistance element VR can be prevented, the film thickness of the silicon nitride film 11 is preferably thinner than the film thicknesses of the silicon oxide film 12 and the silicon nitride film 13.

Moreover, sandwiching the silicon oxide film 12 between the silicon nitride film 11 and the silicon nitride film 13 enables a distance between the memory cell MC and the interlayer insulating film 14 to be lengthened, whereby effects of impurities such as oxygen or carbon released from the interlayer insulating film 14 can be reduced. Furthermore, the silicon oxide film 12 supplies oxygen to the interface between the silicon nitride film 11 having a small composition ratio of nitrogen to silicon and the diode DI, thereby enabling the trap level in a close vicinity of a side surface of the diode DI to be lowered. As a result, it becomes difficult for electrons and so on to be trapped in the side surface of the diode DI, thereby also enabling leak current flowing when the diode DI is off to be reduced.

Moreover, forming the silicon nitride film 13 between the silicon oxide film 12 and the interlayer insulating film 14 allows effects of impurities such as oxygen or carbon released from the interlayer insulating film 14 to be further reduced. However, if the film thickness of the silicon nitride film 13 is made too large, parasitic capacitance between the memory cells MC ends up increasing. Sandwiching the silicon oxide film 12 between the silicon nitride film 11 and the silicon nitride film 13 also has an advantage of lowering permittivity.

In the semiconductor memory device in the present embodiment, forming the silicon nitride film 11, the silicon oxide film 12, and the silicon nitride film 13 on the side surface of the memory cell MC causes an operational defect of the variable resistance element VR to be suppressed, and allows leak current in the diode DI to be reduced. As a result, operational characteristics of the memory cell MC can be improved.

Second Embodiment

Next, a second embodiment of the present invention is described with reference to FIG. 8. An overall configuration of the semiconductor memory device in the present embodiment is similar to that in the first embodiment, hence a detailed description of the overall configuration is omitted. Moreover, places having configurations similar to those in the first embodiment are assigned with symbols identical to those assigned in the first embodiment and a duplicated description of such places is omitted. The above-described first embodiment described a configuration where the silicon nitride film 11 is formed to contact the side surface of the memory cell MC. The second embodiment below describes a configuration where a silicon oxynitride film is formed in place of the silicon nitride film 11.

[Configuration of Periphery of Memory Cell MC]

Figure 8:
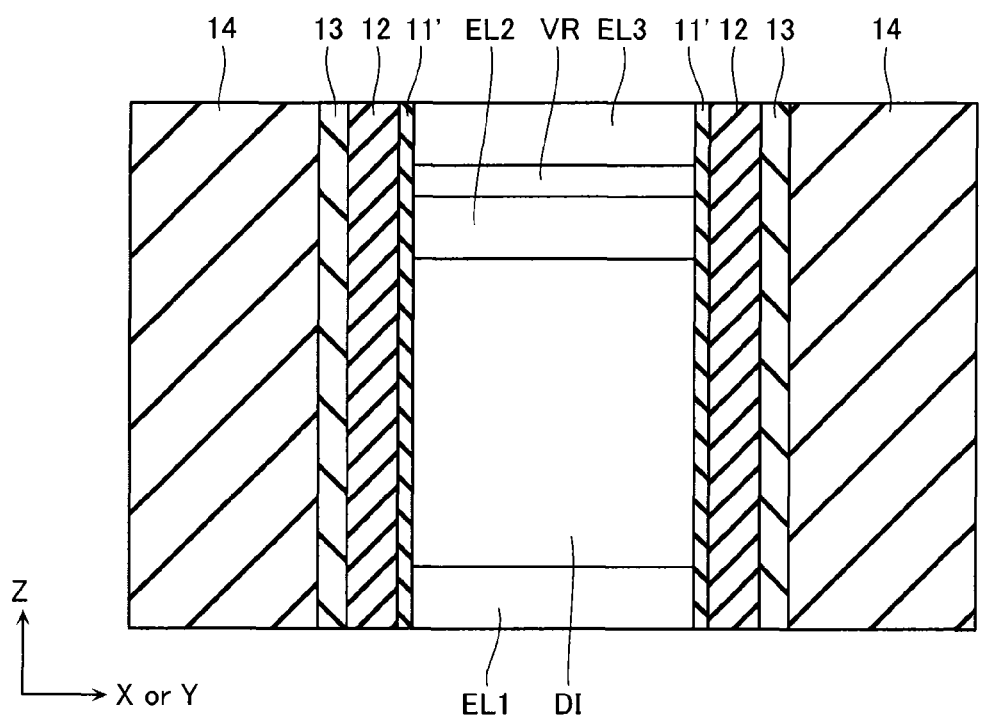
FIG. 8 is one example of a cross-sectional view showing a memory cell and a periphery of the memory cell in a second embodiment.

FIG. 8 is a cross-sectional view showing a memory cell MC and a periphery of the memory cell MC in the present embodiment. As mentioned above, the memory cell MC has a structure where the variable resistance element VR, the diode DI, and the electrodes EL1, EL2, and EL3 are stacked in the Z direction.

The side surface of the memory cell MC in the present embodiment is here provided with a silicon oxynitride film 11'. This silicon oxynitride film 11' is a film formed such that a composition ratio of non-silicon elements (oxygen and nitrogen) to silicon (O,N/Si) configuring the silicon oxynitride film 11' has a value smaller than, for example, 1.33. Moreover, the silicon oxynitride film 11' is provided with a film thickness of, for example, about 1 nm~3 nm.

Configurations of the silicon oxide film 12 and the silicon nitride film 13 are similar to those in the above-described first embodiment. The silicon oxide film 12 and the silicon nitride film 13 are provided with a thickness of, for example, 1 nm or more, and are preferably provided with a film thickness greater than that of the silicon oxynitride film 11'. The composition ratio of nitrogen to silicon (N/Si) configuring the silicon nitride film 13 need only be larger than the composition ratio of non-silicon elements to silicon configuring the silicon oxynitride film 11'. The memory cell MC, and the silicon oxynitride film 11', silicon oxide film 12, and silicon nitride film 13 formed on the side surface of the memory cell MC are buried by the interlayer insulating film 14. Employed as the interlayer insulating film 14 is, for example, polysilazane (PSZ).

[Advantages]

In the structure of the present embodiment, the silicon oxynitride film 11', the silicon oxide film 12, and the silicon nitride film 13 are formed on the side surface of the memory cell MC. This silicon oxynitride film 11' enables oxidation of the variable resistance element VR due to oxygen from the interlayer insulating film 14 or silicon oxide film 12 to be prevented, whereby an operational defect of the memory cell MC can be suppressed. Moreover, the silicon oxide film 12 allows effects of impurities such as oxygen or carbon released from the interlayer insulating film 14 to be reduced. Furthermore, the silicon oxide film 12 supplies oxygen to the interface between the silicon oxynitride film 11' and the diode DI, thereby enabling the trap level in a close vicinity of a side surface of the diode DI to be lowered. As a result, leak current flowing when the diode DI is off can be reduced. Moreover, forming the silicon nitride film 13 between the silicon oxide film 12 and the interlayer insulating film 14 allows effects of impurities such as oxygen or carbon released from the interlayer insulating film 14 to be further reduced.

Likewise in the semiconductor memory device in the present embodiment, forming the silicon oxynitride film 11', the silicon oxide film 12, and the silicon nitride film 13 on the side surface of the memory cell MC causes an operational defect of the variable resistance element VR to be suppressed, and allows leak current in the diode DI to be reduced. As a result, operational characteristics of the memory cell MC can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a first line disposed on a substrate;
   a second line disposed intersecting the first line; and
   a memory cell disposed at an intersection of the first line and the second line and including a variable resistance element,
   the memory cell including, at a side surface thereof:
   a first insulating film including silicon and nitride and the first insulating film provided on a side surface of the variable resistance element and having a composition ratio of a non-silicon element to silicon which is a first value;
   a silicon oxide film provided on a side surface of the first insulating film film; and
   a second insulating film including silicon and nitride and the second insulating film provided on a side surface of the silicon oxide film and having a composition ratio of a non-silicon element to silicon which is a second value, and
   the first value being smaller than the second value.

2. The semiconductor memory device according to claim 1, wherein
   the first insulating film is a silicon nitride film where the first value is smaller than 1.33.

3. The semiconductor memory device according to claim 1, wherein
   the first insulating film is a silicon oxynitride film where the first value is smaller than 1.33.

4. The semiconductor memory device according to claim 1, wherein
   a film thickness of the first insulating film is thinner than a film thickness of the silicon oxide film or the second insulating film.

5. The semiconductor memory device according to claim 1, wherein
   the memory cell is buried by an interlayer insulating film employing polysilazane.

6. The semiconductor memory device according to claim 1, wherein
   the first insulating film contacts a side surface of the memory cell, the silicon oxide film contacts a side surface of the first insulating film on an opposite side to the memory cell, and the second insulating film contacts a side surface of the silicon oxide film on an opposite side to the memory cell.

7. A semiconductor memory device, comprising:
   a first line disposed on a substrate;
   a second line disposed intersecting the first line; and
   a memory cell disposed at an intersection of the first line and the second line and including a variable resistance element,
   the memory cell including, at a side surface thereof:
   a first insulating film including silicon and nitride and the first insulating film provided on a side surface of the variable resistance element;
   a silicon oxide film provided on a side surface of the first insulating film; and
   a second insulating film including silicon and nitride and the second insulating film provided on a side surface of the silicon oxide film.

8. The semiconductor memory device according to claim 7, wherein
   the first insulating film is a silicon nitride film having a composition ratio of a non-silicon element to silicon which is smaller than 1.33.

9. The semiconductor memory device according to claim 7, wherein
   the first insulating film is a silicon oxynitride film having a composition ratio of a non-silicon element to silicon which is smaller than 1.33.

10. The semiconductor memory device according to claim 7, wherein
a film thickness of the first insulating film is thinner than a film thickness of the silicon oxide film.

11. The semiconductor memory device according to claim 7, wherein
a film thickness of the first insulating film is thinner than a film thickness of the second insulating film.

12. The semiconductor memory device according to claim 7, wherein
the memory cell is buried by an interlayer insulating film employing polysilazane.

13. The semiconductor memory device according to claim 7, wherein
the first insulating film contacts a side surface of the memory cell, the silicon oxide film contacts a side surface of the first insulating film on an opposite side to the memory cell, and the second insulating film contacts a side surface of the silicon oxide film on an opposite side to the memory cell.

14. A semiconductor memory device, comprising:
a first line disposed on a substrate;
a second line disposed intersecting the first line; and
a memory cell disposed at an intersection of the first line and the second line and including a variable resistance element,
the memory cell including, at a side surface thereof:
a first insulating film including silicon and nitride and the first insulating film provided on a side surface of the variable resistance element and having a first film thickness;
a silicon oxide film provided on a side surface of the first insulating film; and
a second insulating film including silicon and nitride and the second insulating film provided on a side surface of the silicon oxide film and having a second film thickness which is thicker than the first film thickness.

15. The semiconductor memory device according to claim 14, wherein
the silicon oxide film has a third film thickness which is thicker than the first film thickness.

16. The semiconductor memory device according to claim 14, wherein
the first insulating film is a silicon nitride film having a composition ratio of a non-silicon element to silicon which is smaller than 1.33.

17. The semiconductor memory device according to claim 14, wherein
the first insulating film is a silicon oxynitride film having a composition ratio of a non-silicon element to silicon which is smaller than 1.33.

18. The semiconductor memory device according to claim 14, wherein
the memory cell is buried by an interlayer insulating film employing polysilazane.

19. The semiconductor memory device according to claim 14, wherein
the first insulating film contacts a side surface of the memory cell, the silicon oxide film contacts a side surface of the first insulating film on an opposite side to the memory cell, and the second insulating film contacts a side surface of the silicon oxide film on an opposite side to the memory cell.

* * * * *